(12) United States Patent
Cheng et al.

(10) Patent No.: US 9,629,247 B2
(45) Date of Patent: Apr. 18, 2017

(54) LENS FOR ILLUMINATING DEVICE AND ILLUMINATING DEVICE HAVING SAID LENS

(71) Applicant: OSRAM GmbH, Munich (DE)

(72) Inventors: Xiongjie Cheng, Shenzhen (CN); Zuzhi Wang, Shenzhen (CN); Aimin Lin, Shenzhen (CN); Tingming Liu, Shenzhen (CN)

( * ) Notice: Subject to any disclaimer, the term of this patent is extended or adjusted under 35 U.S.C. 154(b) by 0 days.

(21) Appl. No.: 14/898,757

(22) PCT Filed: Jun. 3, 2014

(86) PCT No.: PCT/EP2014/061451
§ 371 (c)(1),
(2) Date: Dec. 16, 2015

(87) PCT Pub. No.: WO2014/202380
PCT Pub. Date: Dec. 24, 2014

(65) Prior Publication Data
US 2016/0143146 A1 May 19, 2016

(30) Foreign Application Priority Data

Jun. 20, 2013 (CN) .......................... 2013 1 0247264

(51) Int. Cl.
*H05K 1/18* (2006.01)
*H05K 3/30* (2006.01)

(52) U.S. Cl.
CPC ............ *H05K 1/181* (2013.01); *H05K 3/303* (2013.01); *H05K 2201/10106* (2013.01); *H05K 2201/10121* (2013.01); *H05K 2201/10515* (2013.01); *H05K 2201/10568* (2013.01); *H05K 2203/166* (2013.01); *Y02P 70/611* (2015.11); *Y02P 70/613* (2015.11)

(58) Field of Classification Search
CPC .. H05K 1/181; H05K 3/303; H05K 2203/166; H05K 2201/10568; H05K 2201/10106; H05K 2201/10121; H05K 2201/10515; Y02P 70/611; Y02P 70/613
USPC ..................................................... 362/311.02
See application file for complete search history.

(56) References Cited

U.S. PATENT DOCUMENTS 5,890,794 A 4/1999 Abtahi et al.
8,083,380 B2 * 12/2011 Zhou .......................... F21K 9/00
257/98

(Continued)

OTHER PUBLICATIONS

International Search Report based on application No. PCT/EP2014/061451 (5 pages) dated Nov. 28, 2014 (for reference purpose only).

*Primary Examiner* — Laura Tso
(74) *Attorney, Agent, or Firm* — Viering, Jentschura & Partner mbB

(57) ABSTRACT

Various embodiments may relate to a lens for an illuminating device and an illuminating device having a lens of the above mentioned type, wherein the lens includes a bottom plate and at least one optical part formed on the bottom plate, wherein the lens further includes at least two assembly parts that are position-fixedly formed on the bottom plate, and the assembly parts are configured to be respectively aligned with assembly positions on a circuit board of the illuminating device and configured to allow to be soldered to the circuit board.

17 Claims, 2 Drawing Sheets

(56) References Cited

U.S. PATENT DOCUMENTS

| | | | |
|---|---|---|---|
| 8,833,979 B2* | 9/2014 | Wang | F21V 5/04 362/311.01 |
| 2004/0079957 A1 | 4/2004 | Andrews et al. | |
| 2009/0103296 A1 | 4/2009 | Harbers et al. | |
| 2010/0002450 A1* | 1/2010 | Pachler | H01L 33/58 362/311.02 |
| 2010/0073907 A1* | 3/2010 | Wanninger | G02B 3/04 362/97.1 |
| 2010/0123164 A1 | 5/2010 | Suehiro et al. | |
| 2011/0194279 A1* | 8/2011 | Kuo | F21S 2/005 362/235 |
| 2012/0051065 A1* | 3/2012 | Daily | F21V 5/007 362/311.02 |
| 2012/0127730 A1* | 5/2012 | Shih | F21V 5/04 362/311.02 |
| 2013/0229810 A1* | 9/2013 | Pelka | F21V 5/04 362/311.02 |

* cited by examiner

LENS FOR ILLUMINATING DEVICE AND ILLUMINATING DEVICE HAVING SAID LENS

RELATED APPLICATIONS

The present application is a national stage entry according to 35 U.S.C. §371 of PCT application No. PCT/EP2014/061451 filed on Jun. 3, 2014, which claims priority from Chinese application No.: 201310247264.2 filed on Jun. 20, 2013, and is incorporated herein by reference in its entirety.

TECHNICAL FIELD

Various embodiments relate to a lens for an illuminating device. In addition, various embodiments further relate to an illuminating device having a lens of the above mentioned type.

BACKGROUND

At present, LED products are applied to daily life in a great amount. Because of advantages of LEDs (light emitting diodes) such as stable performance, easy and inexpensive manufacture, and low power consumption, conventional halogen lamps are gradually replaced with LEDs. However, due to own characteristics of LED light sources, light emitted hereby have to be subjected to secondary optical processing; otherwise, application requirements in most application situations will not be satisfied. For this reason, LED light sources have to be equipped with a lens, and a specially designed lens can enable light emitted by the LED light sources to achieve expected effects.

For practical applications, for example, a plurality of LED chips distributed in an array is usually used in a streetlight which utilizes LED chips as light sources, and a special lens is equipped for each LED chip or a common lens is equipped for the plurality of LED chips. However, a problem often occurs, viz. the assembly accuracy between the LED chips and the lens determines whether the practical illuminating effect of the streetlight is good or bad. In order to solve the above problem, several technical solutions are raised in the prior art, wherein according to a technical solution, an erection column is formed on the lens, a threaded hole is formed in the erection column, and the lens is fixed on a circuit board by screwing a bolt into the threaded hole. However, such a bolted connection mode cannot well assure the assembly accuracy between the lens and the LED chips. Another technical solution provides that an assembly hole is opened on the circuit board, while a locating pin is formed on the lens, said locating pin is inserted into the assembly hole, and a part of the locating pin, which is exposed through the circuit board, is melted at the other side of the circuit board and forms a fixing and holding part after cooling. However, the disadvantage of said technical solution lies in that a gap exists between the locating pin and a mounting plate, which might result in a relative displacement of the lens with respect to the LED chips, and then detrimentally influence the illuminating performance of the illuminating device.

SUMMARY

Various embodiments provide a lens for an illuminating device. Said lens can ensure a precise alignment between the lens and the LED chips, while assuring that no translocation occurs between the lens and the LED chips after the assembly, and hereby realizing expected light distribution performance. In addition, the present invention further relates to an illuminating device having a lens of the above mentioned type.

Various embodiments provide a lens for an illuminating device, viz. said lens includes a bottom plate and at least one optical part formed on the bottom plate, wherein the lens further includes at least two assembly parts that are position-fixedly formed on the bottom plate, and the assembly parts are configured to be respectively aligned with assembly positions on a circuit board of the illuminating device and configured to allow to be soldered to the circuit board. In an embodiment of the present disclosure, during assembly, the lens has to be firstly precisely aligned with the assembly position on the circuit board, and then soldered on the assembly position on the circuit board. It assures on one hand an accurate alignment between the lens and the light source of the illuminating device during installation, and prevents, after the assembly, the lens from moving with respect to the light source through the way of soldering, and assures the illuminating performance of the illuminating device in this way.

According to the present disclosure, it is provided that the assembly parts are formed integrally with the bottom plate as one piece. During assembly, it is generally required that the lens is placed at the assembly position of the circuit board, and the assembly part, which is formed integrally with the bottom plate as one piece, is placed on the assembly position together with the lens during the installation, so that an assembly operator does not have to separately place the assembly part between the lens and the circuit board, in which the assembly efficiency is improved. Moreover, the position of the assembly part is determined at the beginning of the manufacture of the lens, and thus, a precise alignment between the lens and the light source can be realized just by aligning the assembly part with the assembly position on the circuit board during the assembly.

It is provided that the assembly part is configured to allow the lens to be mounted to the circuit board through surface mount technology. The assembly difficulty of the lens according to the present invention on the circuit board is further simplified through the surface mount technology.

According to the present disclosure, it is provided that the assembly part is formed in the bottom plate through insert moulding process. The assembly part can be simply fixed in the bottom plate through the insert moulding process.

It is provided that the assembly part is partially encapsulated in the bottom plate. In other words, a part of the assembly part is exposed out of the bottom plate, and said exposed part can support the lens, while simultaneously being at least partially used as a soldering position for soldering with the assembly position.

It is provided that a thermal insulation layer is provided on a section of the assembly part that is encapsulated by the bottom plate. During soldering of the assembly part, a great amount of heat is inevitably produced, and if said heat is transferred to the optical part of the lens, which is usually made of a transparent plastic, the optical part would be deformed. In the meanwhile, the thermal insulation layer can avoid heat transfer to the bottom plate, even the optical part, of the lens.

In various embodiments, the thermal conductivity of the thermal insulation layer is less than 0.5 W/(m*K). Thus a proper heat insulation effect can be ensured.

According to various embodiments, it is provided that the assembly part is configured to have a U-shaped section profile, wherein the U-shaped assembly part includes a first landing leg, a second landing leg, and a connecting part connected between the first landing leg and the second landing leg, wherein the first landing leg is configured as a part encapsulated by the bottom plate. Actually, the first landing leg of the U-shaped assembly part is inserted into the material of the bottom plate, so as to be firmly fixed at a predetermined position on the bottom plate.

It is further provided that the U-shaped assembly part is configured in such a manner that after fixation onto the bottom plate, all the parts, with exception of the first landing leg, are separated from the bottom plate. A gap is hereby formed between the second landing leg and the bottom plate, and between the connecting part and the bottom plate. When soldering the assembly part, deformation of the assembly part resulted from a high temperature thereof would not directly influence the bottom plate, so as to avoid damage of the lens.

It is provided that the assembly part is fixed in the bottom plate such that the second landing leg extends parallel to the circuit board, wherein one surface of the second landing leg forms a solder side. The second landing leg has a certain surface area, and its use as a solder side can assure that the lens is firmly fixed at the assembly position on the circuit board.

It is provided according to the present disclosure that the assembly parts respectively have a first reference position, and the assembly positions of the circuit board have a second reference position for alignment with the first reference position. It is advantageous that a free end of the second landing leg forms the first reference position. In order that the lens can be precisely arranged on the circuit board, a reference position has to be predefined on the assembly part. And the second reference position can be an edge of a solder pad on the circuit board, which solder pad serves as the assembly position. As a result, during actual assembling process, the assembly operator can assure a precise arrangement of the lens on the circuit board, just by aligning the first reference position with the edge of the solder pad.

It is further provided according to the present disclosure that the assembly part is formed by bending a sheet metal. A sheet metal is more beneficial to soldering. And it is advantageous that the sheet metal is made of copper. The metal copper is more suitable for soldering.

Various embodiments also provide an illuminating device, said illuminating device including a circuit board; and at least one LED chip provided on the circuit board, wherein the illuminating device further includes a lens of the above mentioned type, and the lens is soldered on the circuit board.

It is provided that at least two assembly positions are provided on the circuit board, and the assembly parts of the lens are respectively soldered at the assembly positions.

It is further provided that the assembly position is composed of a metal plate, wherein at least one edge position of the metal plate is configured as the second reference position.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form a part hereof, and in which is shown by way of illustration specific embodiments in which the invention may be practiced. In this regard, directional terminology, such as "left", "right", "upper", "lower", is used in reference to the orientation of the figures being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
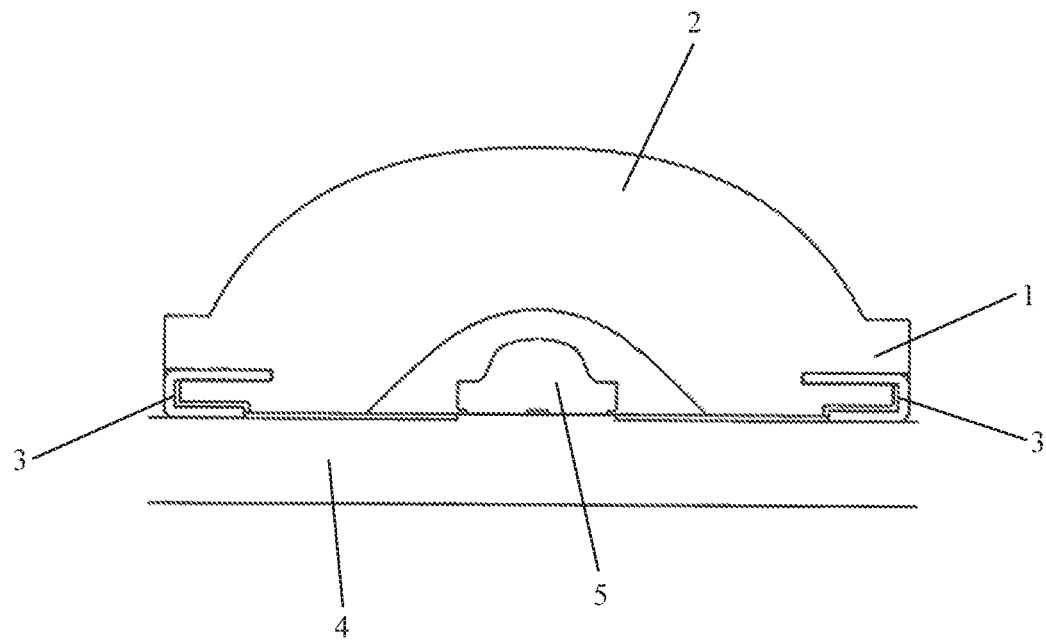
FIG. 1 is a sectional view of a lens according to the present invention.

FIG. 1 shows a sectional view of the lens 100 according to the present disclosure. It can be seen from the figure that said lens 100 includes a bottom plate 1 and at least one optical part 2 formed on the bottom plate 1, wherein said lens 100 further includes at least two assembly parts 3 that are position-fixedly formed on the bottom plate 1. In the example as shown in FIG. 1, said lens 100 has assembly parts 3 respectively arranged at two opposite ends of the bottom plate 1 of the lens 100. However, according to embodiments of the present disclosure, the lens 100 can include assembly parts 3 of other amounts, e.g. 3 or 4 etc., and no matter how many assembly parts 3 are used, the assembly parts 3 are preferably arranged on the bottom plate 1 in an equal interval.

Moreover, in FIG. 1, under the lens 100, a circuit board 4 of an illuminating device 200 and a light source arranged on the circuit board 4 are shown. In the present example, said light source is configured as an LED chip 5.

During a practical assembling process, the LED chip 5 is firstly soldered onto a circuit board 4 using a chip mounter. The assembly part 3 is then soldered onto the assembly position 41 on the circuit board 4 of the illuminating device 200 (see FIG. 3), so that the lens 100 is fixed on the circuit board 4. And certainly, during soldering the assembly part 3, the chip mounter could be used to conduct coordinate setting, or the coordinate setting could be simply conducted by the corresponding reference positions of the assembly part 3 and assembly position 41, so as to ensure an accurate positional relationship between the lens 100 and the LED chip 5.

Figure 2:
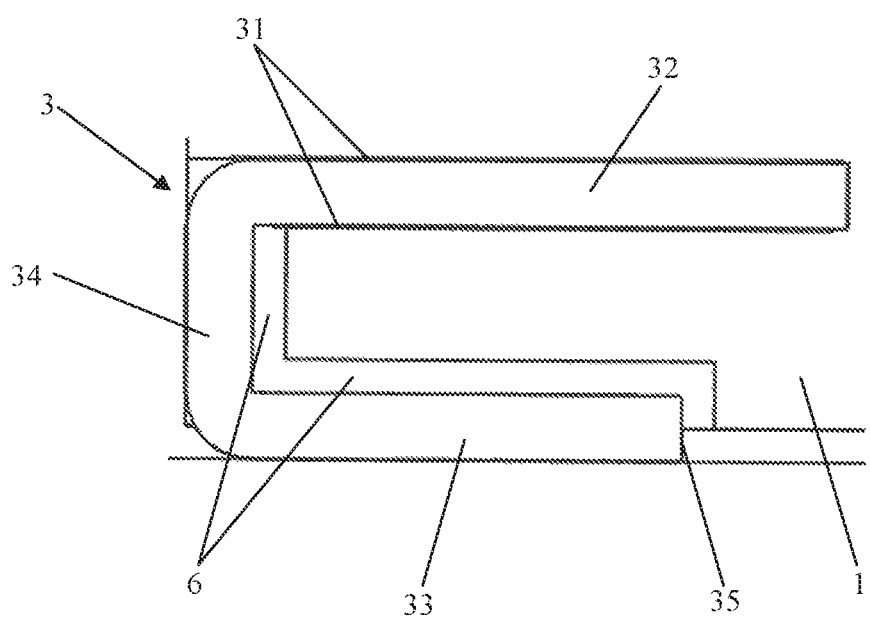
FIG. 2 is an amplified sectional view for the region of assembly parts of the lens according to the present invention.

FIG. 2 shows an amplified sectional view for the region of the assembly parts 3 of the lens 100 according to the present disclosure. It can be seen from the figure that the assembly parts 3 and the bottom plate 1 are formed as one piece, in other words, the assembly parts 3 are formed in the bottom plate 1 through insert moulding process. However, it can further be seen from the figure that the assembly part 3 is only partially encapsulated in the bottom plate 1. Moreover, an thermal insulation layer 31 is provided on a section of the assembly plate 3, which is encapsulated by the bottom plate 1. Preferably, the thermal conductivity of the thermal insulation layer is less than 0.5 W/(m*K). In an embodiment of the present disclosure, the assembly part has to be soldered, which inevitably produces a great amount of heat, and if said heat is transferred to the optical part 2 of the lens 100 which is usually made of a transparent plastic, the optical part 2 would be deformed. In the meanwhile, the thermal insulation layer 31 can avoid heat transfer to the bottom plate 1, even the optical part 2, of the lens 100.

Moreover, it can be seen from the figure that the assembly part 3 is configured to have a U-shaped section profile, wherein the U-shaped assembly part 3 includes a first landing leg 32, a second landing leg 33, and a connecting part 34 connected between the first landing leg 32 and the second landing leg 33, wherein the first landing leg 32 is configured as a part encapsulated by the bottom plate 1. Actually, the first landing leg 32 is inserted into the material of the bottom plate 1. However, the U-shaped assembly part 3 is configured in such a manner that after fixation into the bottom plate 1, all the parts, except for the first landing leg, including the second landing leg 33 and the connecting part 34, are separated from the bottom plate 1. A gap 6 is hereby formed between the second landing leg 33 and the bottom plate 1, and between the connecting part 34 and the bottom plate 1. When soldering the assembly part 3, deformation of the assembly part 3 resulted from a high temperature thereof would not directly influence the bottom plate 1, so as to avoid damage of the lens 100.

In addition, as the U-shaped assembly part 3 is fixed in the bottom plate 1 in such a fixing way that the second landing leg 33 extends parallel to the circuit board 4, wherein one surface of the second landing leg 33 forms a solder side. Specifically, it can be seen from FIG. 2 that the open end of the U-shaped assembly part 3 faces the right side of the shown view, while the connecting part 34 is aligned with an outer edge of the bottom plate 1 of the lens 100.

Figure 3:
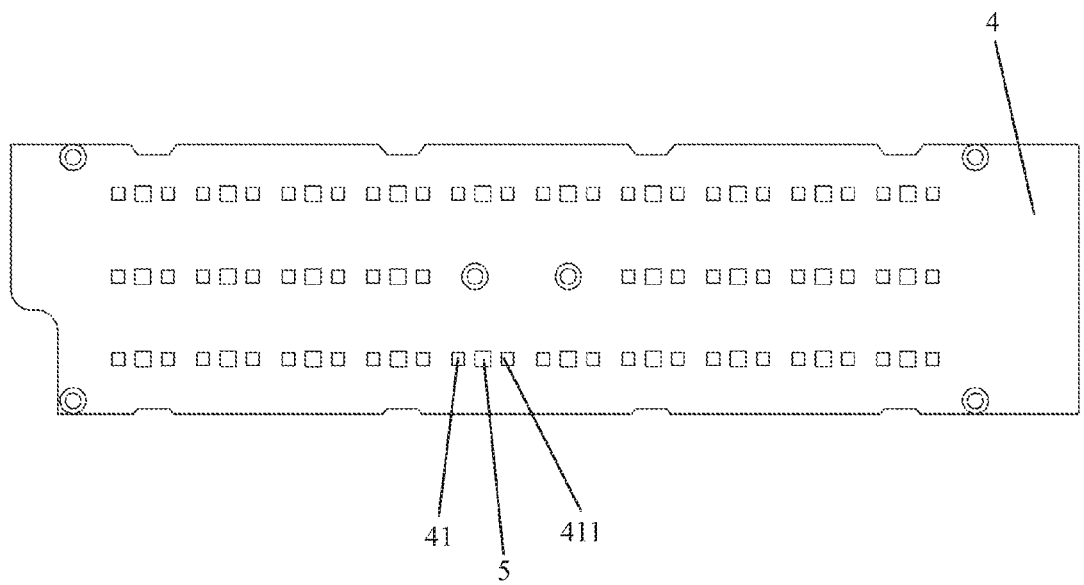
FIG. 3 is a top view of a circuit board of an illuminating device according to the present invention.

Furthermore, in order to assure that the assembly parts 3 can be accurately aligned with the assembly positions 41 on the circuit board 4, the assembly parts 3 respectively have a first reference position 35, and the assembly positions 41 of the circuit board 4 have a second reference position 411 for alignment with the first reference position 35 (see FIG. 3). In the example as shown in FIG. 2, a free end of the second landing leg 33 forms the first reference position 35. However, in an optional example, if the connecting part 34 can be oriented to be perpendicular to the circuit board 4, the surface of the connecting part 34 away from the U-shaped opening can be configured as a reference surface of the first reference position 35, so that the assembly part 3 is soldered after the reference surface has been aligned with the second reference position 411.

In the present example, the assembly part 3 is formed by bending a sheet metal. It is preferably that said sheet metal is made of copper, and of course, it can also be made of other metals suitable for soldering.

FIG. 3 shows a top view of the circuit board 4 of the illuminating device 200 according to the present disclosure. Said circuit board 4 is configured to be rectangular, and preferably used in the illuminating device 200 as a streetlight. A plurality of LED chips 5 serving as light sources is arranged on the circuit board 4 in an array. It can be clearly seen from FIG. 3, an assembly position 41 is arranged respectively on the left and right side of each of the LED chips 5. However, according to the embodiment of the present disclosure, the number of the assembly position 41 is not limited to two, it could be more than two, for instance, three or four. In addition, the position of the assembly positions 41 on the circuit board 4 is not limited to the left and right side of each of the LED chips 5, it could be on the upper and lower side of each of the LED chips 5. It should be noticed that the number and also the position of the assembly positions 41 are in accordance with that of the assembly parts 3 arranged on the lens 100. It can further be seen from the figure that said assembly position 41 is composed of a metal plate that is configured to be rectangular, wherein one edge position of said metal plate is configured as the second reference position 411. In said example, the circuit board is an FR-4 type printed circuit board, and of course, it can also be a circuit board of other types, e.g. a metal core printed circuit board (MCPCT) or a ceramic printed circuit board etc.

Figure 4:
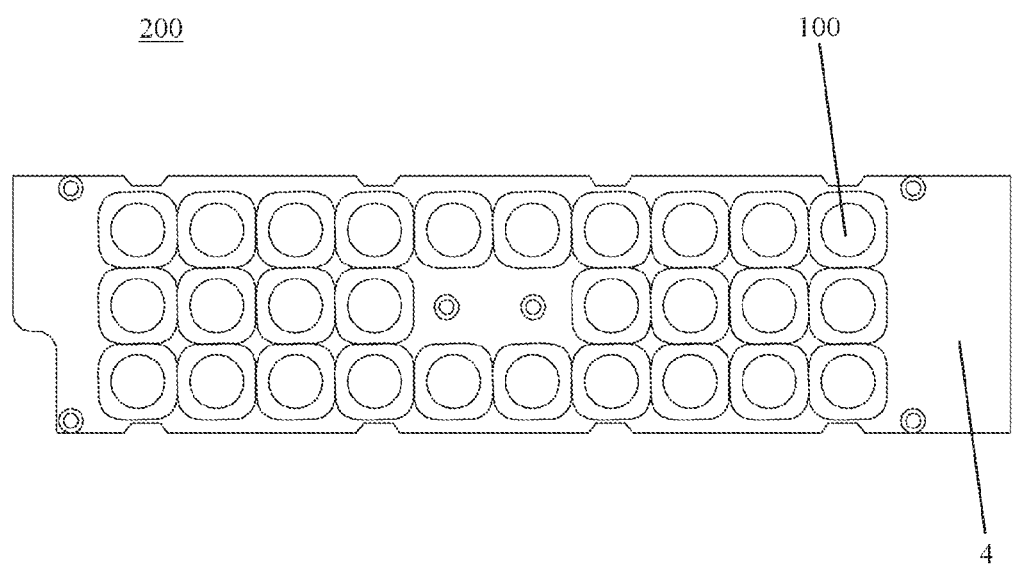
FIG. 4 is a top view of the illuminating device according to the present invention.

FIG. 4 shows a top view of the illuminating device 200 according to the present disclosure with an assembled lens 100. It can be seen from the figure that a plurality of lenses 100 is fixed on the circuit board 100, wherein each lens 100 corresponding to one LED chip 5. However, it has to be emphasized hereby that there is unnecessarily only one optical part 2 on the lens 100, viz. the lens 100 can be configured to have a plurality of optical parts 2, wherein each optical part 2 corresponds to one LED chip 5, in other words, each lens 100 can simultaneously serve a plurality of LED chips 5 located in the lens 100.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lens for an illuminating device, the lens comprising:
a bottom plate and
at least one optical part formed on the bottom plate,
wherein the lens further comprises at least two assembly parts that are position-fixedly formed on the bottom plate, and the assembly parts are configured to be respectively aligned with assembly positions on a circuit board of the illuminating device and configured to allow to be soldered to the circuit board.

2. The lens according to claim 1, wherein the assembly parts are formed integrally with the bottom plate as one piece.

3. The lens according to claim 1, wherein the assembly part is configured to allow the lens to be mounted to the circuit board through surface mount technology.

4. The lens according to claim 3, wherein the assembly part is formed in the bottom plate through insert moulding process.

5. The lens according to claim 4, wherein the assembly part is partially encapsulated in the bottom plate.

6. The lens according to claim 5, wherein a thermal insulation layer is provided on a section of the assembly part that is encapsulated by the bottom plate.

7. The lens according to claim 6, wherein the thermal conductivity of the thermal insulation layer is less than 0.5 W/(m*K).

8. The lens according to claim 5, wherein the assembly part is configured to have a U-shaped section profile, wherein the U-shaped assembly part includes a first landing leg, a second landing leg, and a connecting part connected between the first landing leg and the second landing leg, wherein the first landing leg is configured as a part encapsulated by the bottom plate.

9. The lens according to claim 8, wherein the U-shaped assembly part is configured in such a manner that after fixation onto the bottom plate, all the parts, with exception of the first landing leg, are separated from the bottom plate.

10. The lens according to claim 8, wherein the assembly part is fixed in the bottom plate such that the second landing leg extends parallel to the circuit board, wherein one surface of the second landing leg forms a solder side.

11. The lens according to claim 1, wherein the assembly parts respectively have a first reference position, and the assembly positions of the circuit board have a second reference position for alignment with the first reference position.

12. The lens according to claim 11, wherein a free end of the second landing leg forms the first reference position.

13. The lens according to claim 1, wherein the assembly part is formed by bending a sheet metal.

14. The lens according to claim 13, wherein the sheet metal is made of copper.

15. An illuminating device, comprising:
a circuit board; and
at least one LED chip provided on the circuit board,
wherein the illuminating device further comprises a lens, and the lens is soldered on the circuit board
the lens comprising:
a bottom plate, and
at least one optical part formed on the bottom plate,
wherein the lens further comprises at least two assembly parts that are position-fixedly formed on the bottom plate, and the assembly parts are configured to be respectively aligned with assembly positions on the circuit board of the illuminating device.

16. The illuminating device according to claim 15, wherein at least two assembly positions are provided on the circuit board, and assembly parts of the lens are respectively soldered at the assembly positions.

17. The illuminating device according to claim 16, wherein the assembly position is composed of a metal plate, wherein at least one edge position of the metal plate is configured as the second reference position.

* * * * *